US 6,617,679 B2

(12) United States Patent
van Zyl (10) Patent No.: US 6,617,679 B2
(45) Date of Patent: Sep. 9, 2003

(54) SEMICONDUCTOR PACKAGE FOR MULTIPLE HIGH POWER TRANSISTORS (75) Inventor: Gideon van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

(21) Appl. No.: 10/071,621

(22) Filed: Feb. 8, 2002

(65) Prior Publication Data

US 2003/0151114 A1 Aug. 14, 2003

(51) Int. Cl.[7] .............................................. H01L 23/52
(52) U.S. Cl. ...................... 257/691; 257/723; 257/724
(58) Field of Search ................................. 257/691, 723, 257/724, 664

(56) References Cited

U.S. PATENT DOCUMENTS

| 4,021,838 A | * | 5/1977 | Warwick |
| 4,042,952 A | * | 8/1977 | Karybill |
| 4,393,392 A | * | 7/1983 | Hale |
| 6,002,166 A | * | 12/1999 | Noda et al. |
| 6,249,024 B1 | * | 6/2001 | Mangtani |
| 6,414,389 B1 | * | 7/2002 | Hume et al. |

OTHER PUBLICATIONS

Power Mosfets Theory and Applications by Ducan A. Grant, John Gowar.

* cited by examiner

Primary Examiner—Sheila V. Clark
(74) Attorney, Agent, or Firm—Benjamin Hudson, Jr.

(57) ABSTRACT

There is provided by this invention a novel and unique configuration for combining multiple die such as metal oxide field effect transistors (MOSFETS) in high power high frequency applications to prevent internal oscillation. A first embodiment of this invention comprises a split gate design wherein the gate distribution network for multiple semiconductor devices is split to provide individual gate feeds to each device. A second embodiment provides a plurality of semiconductors devices arranged in a configuration such that the reference terminals are connected together at a common point at the approximate center of the configuration that allows external connections to the semiconductor devices' input and output terminals positioned on the outer periphery of the configuration design.

12 Claims, 14 Drawing Sheets

SEMICONDUCTOR PACKAGE FOR MULTIPLE HIGH POWER TRANSISTORS

BACKGROUND OF THE INVENTION

1. Field of the Invention

This invention relates generally to a technique for connecting multiple semiconductor devices in a single configuration, and more particularly to a technique for mounting multiple high power metal oxide field effect transistors (MOSFETS) in a single configuration that eliminates internal oscillations while maximizing device performance such as gain, bandwidth, etc. while reducing package complexity.

2. Brief Description of the Prior Art

The desire for high power semiconductor devices has led manufacturers to combining multiple die in a single package in such a way that the package has the characteristics of a single semiconductor device. This precedent has long been established in devices designed to run at higher frequencies. While lower frequency applications have driven device manufactures to make larger single die to handle higher power densities, high frequency applications favor parallel combinations of smaller die to maximize device performance and better control power dissipation at the intended frequency of use. It has been found that these devices may be subject to internal oscillations. Such as when four transistor die are combined, two die or two pairs of die can oscillate 180 degrees out of phase, three die can oscillate 120 degrees out of phase, or four die can oscillate 90 degrees out of phase. As a result the external connections act as virtual grounds and nothing that is done external to the package can prevent the internal oscillations when the device is biased in its active region. This problem is known, though more often solved by placing resistors in the gate of combined MOSFET devices to prevent the oscillations, though at the expense of device performance. Most MOSFET packages which utilize multiple combined die benefit from a very low impedance source connection which is generally connected directly to the amplifier ground. This physical connection will be shown to enable greater stability, allowing some packages to eliminate the gate resistors altogether. As new topologies in use at higher frequencies begin to take advantage of higher voltage and higher speed devices, power semiconductor packages are required to be isolated from the local ground source. Existing semiconductor packages which combine multiple die and newer ones which utilize similar die-interconnect methods with their grounded-source predecessors would now suffer from instabilities, forcing a solution which compromises device performance to resolve. A similar problem is developing in lower frequency semiconductor devices. Although these devices are typically isolated to begin with, issues with increasing power cycling requirements have called for smaller multiple combined die to replace the existing larger single die, now creating internal oscillations that had not previously been noted. Although utilization of high frequency oscillation dampening methods, including gate resistors, may not notably affect device performance, it does increase the package complexity, and therefore cost.

Figure 1:
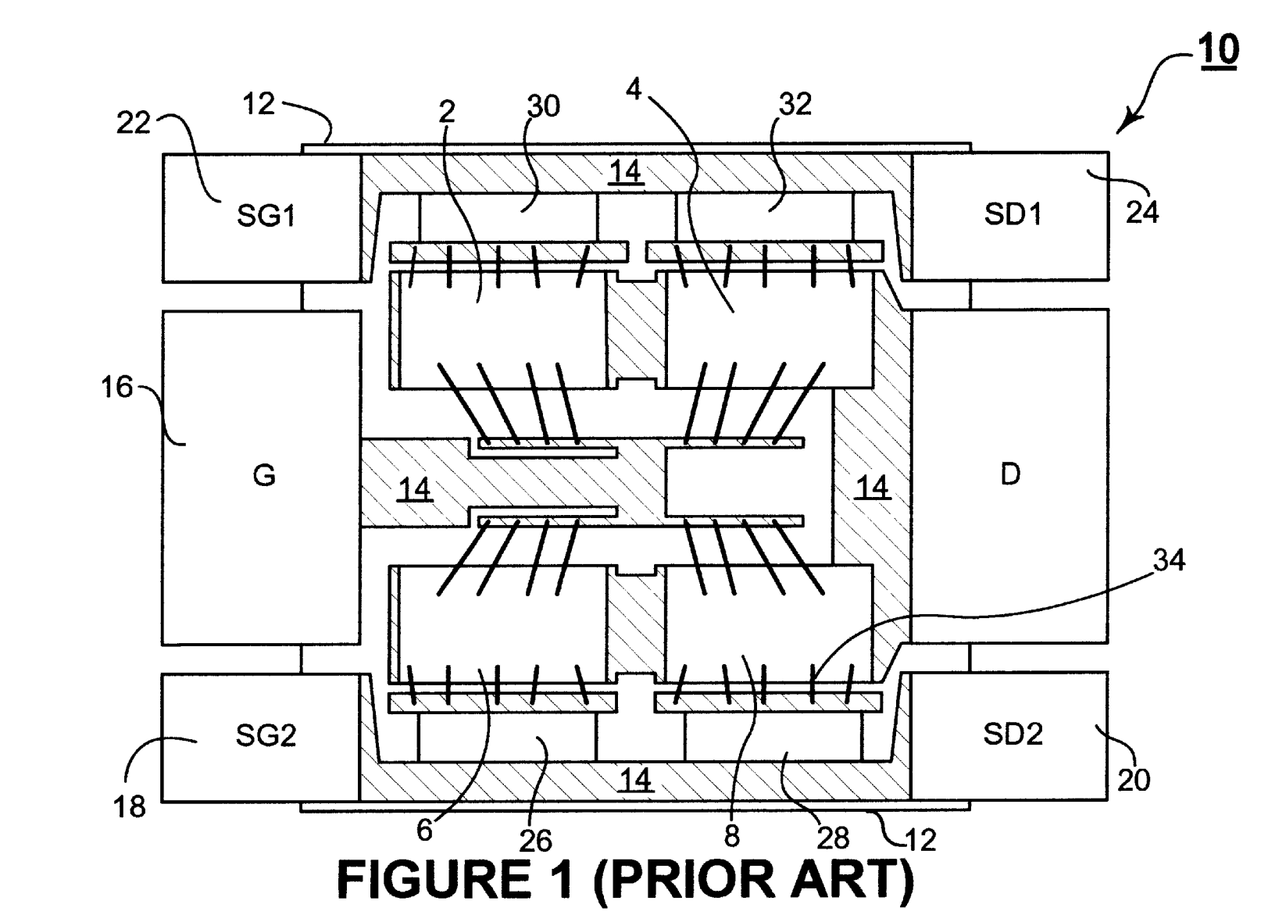
FIG. 1 is an illustration of a prior apparatus for combining multiple FETs.

One example of a prior art packaging design is shown in FIG. 1. In FIG. 1 there is shown field effect transistor (FET) die 2,4,6, and 8 that are mounted in a single package generally shown as 10. The package consists of a ceramic base 12 providing a supporting structure and metallizations 14 shown hashed which forms the interconnects. The package consists of one gate terminal 16 and four separate source terminals 18, 20, 22, and 24, which are connected in pairs. Terminal 18 is connected to terminal 20 and terminal 22 is connected to 24 by the metallizations on the ceramic base 12. No internal connection is made between the terminals 18 and 22. Also shown are four source resistors 26, 28, 30, and 32 connected to the die by wire bonds such as 34. As will be shown herein after, because there is no low inductance connection between the source of each die and the first point where the sources are connected together, internal oscillations can result with the FET pairs 2–4 and 6–8 taking part in the oscillation. The package of this design is especially vulnerable to internal oscillations if the source is not grounded, i.e. allowed to float as is frequently required. In a floating source design the inductance between the two groups of source terminals 18–20 and 22–24 can be high enough to cause the internal oscillations described herein.

Figure 2A:
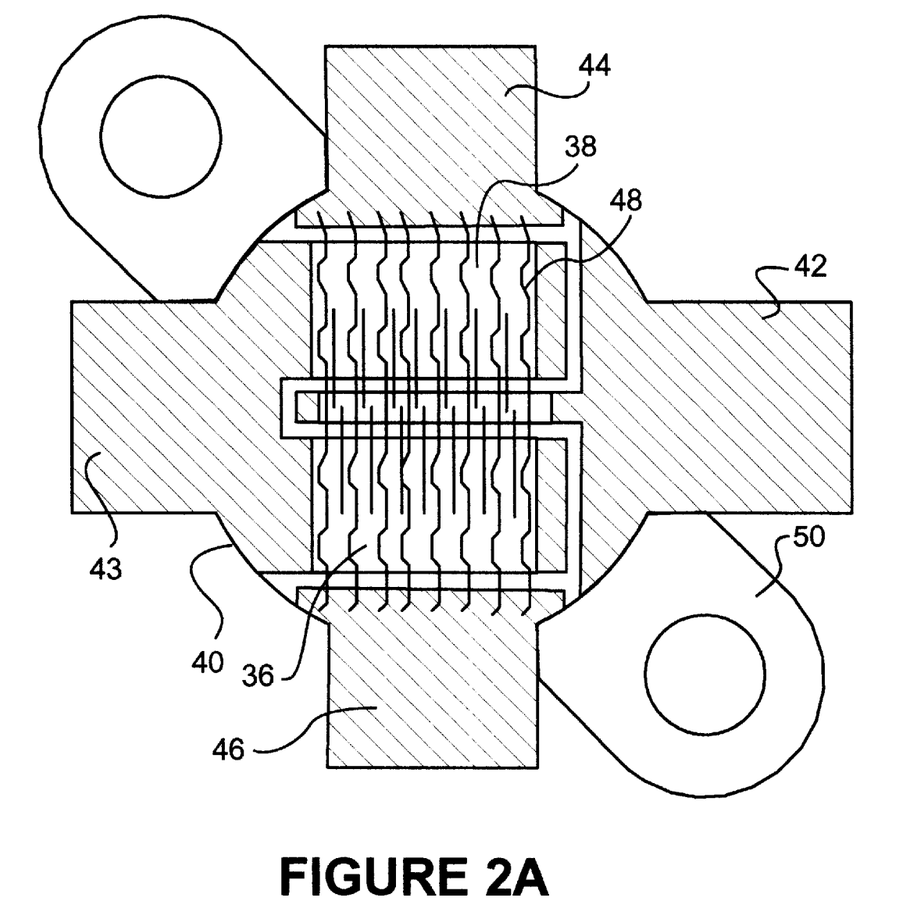
FIG. 2a is a plan view illustrating a prior art apparatus for combining multiple FETs.
Figure 2B:
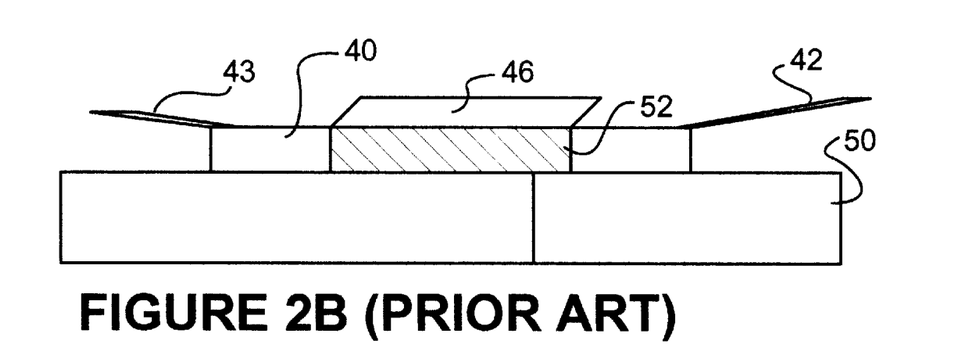
FIG. 2b is a sectional view illustrating a prior art apparatus for combining multiple FETs.

Another example of a prior art packaging technique is shown in FIG. 2. This example has two die 36 and 38 on a ceramic insulator 40. The gate distribution network 42 runs along the center of the package and two source connections 44 and 46 are on the edges of the package. Although the source wire bonds such as 48 connect the two die, the high inductance of this connection necessitates the connection of the source terminals 44 and 46 to the conducting base 50 through conductive strips 52 along the side of the package. Designs like this, which has the gate along the middle of the configuration of devices, is fairly typical of prior art designs. This is also found in U.S. Pat. No. 6,020,636 issued to G. C. Adishian wherein the gates are arranged in the geometric center of the configuration and the sources connected along the outside. In this case gate resistors are utilized.

Figure 3A:
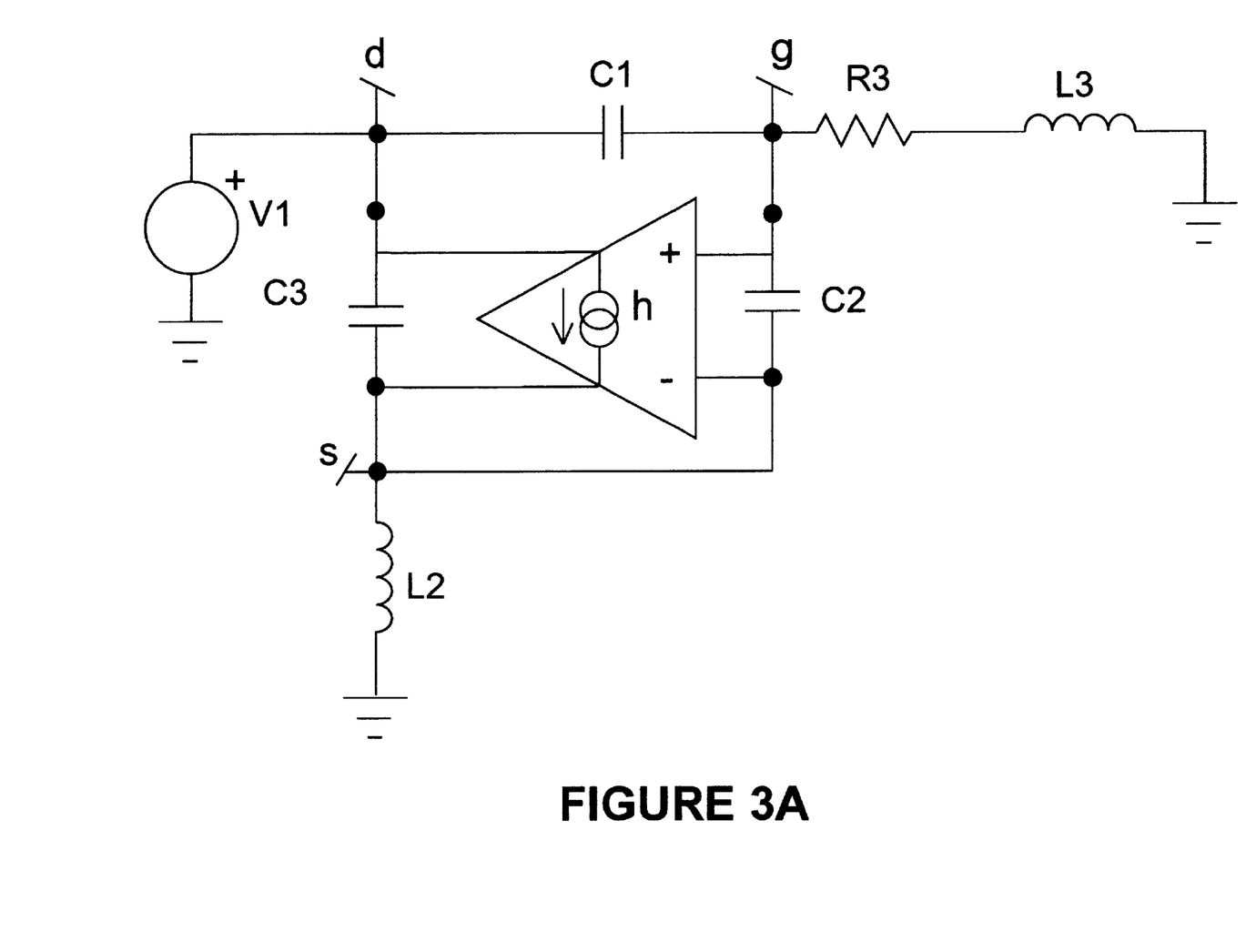
FIG. 3a is a linearized equivalent circuit of a single transistor die.
Figure 3B:
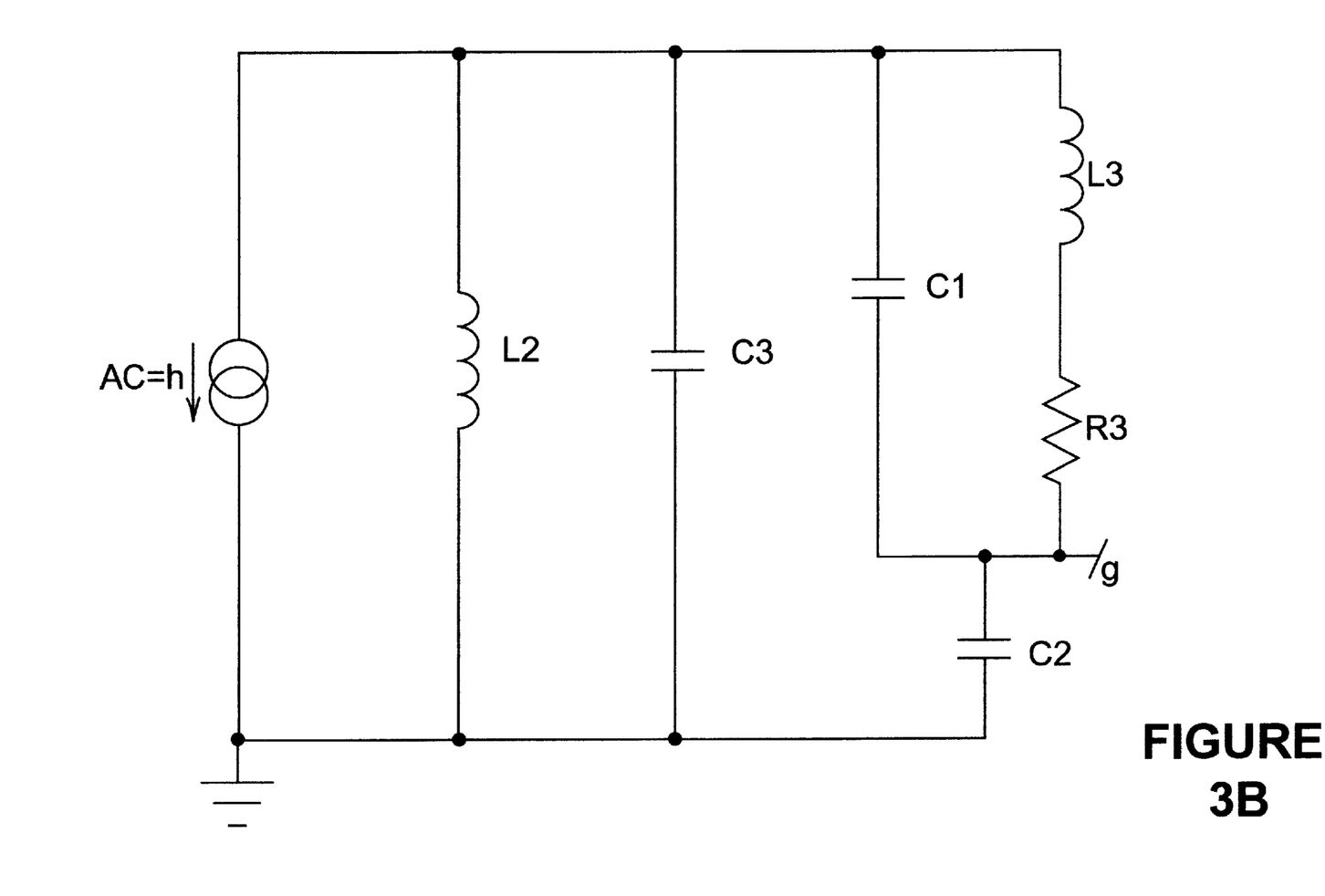

Since the external gate, drain and source connections act as virtual grounds when the configuration of devices oscillate internally, the oscillations can be analyzed by considering the equivalent circuit of a single device taking part in the oscillation. A linearized model is good enough to explain the onset of oscillations and the methods required to prevent such oscillations, which is the object of the present invention. A model of a single die (or a group of die acting in concert) with parasitic components and the transformations required to obtain a simple circuit from which to determine the loop gain is shown in FIG. 3. In FIG. 3(a) the linearized current gain (change in drain to source current over the change in gate to source voltage) of a single die is denoted by h. The gate, drain and source terminals are labeled g, d, and s respectively. C1, C2 and C3 represent the linearized incremental gate-drain, gate-source and drain-source capacitances, respectively. R3 represents the gate resistance. The parasitic inductance, bond wires and interconnect, between the die and the point where the gates of the various die are first connected together is represented by L3 and the parasitic inductance between the source and the point where the sources are first connected together is represented by L2. The drain inductance is ignored in this analysis, as it is usually small. By transforming the circuit as shown in FIG. 3(b), the loop gain is simply the voltage at the gate (g). In FIG. 3(b) AC=h indicates an independent sinusoidal current source with amplitude h. A typical set of parameters is shown in Table 1.

TABLE 1

Typical Parameters

| Parameter | Value | Units |
|---|---|---|
| C1 | 50 | pF |
| C2 | 1.45 | nF |
| C3 | 100 | pF |
| L2 | 6 | nH |
| R3 | 1.5 | Ω |

With typical parameters like these, the following critical observation is made. If the phase of the loop gain is plotted vs. frequency and L3 is varied, there is a critical value of L3 at which the phase change at resonance changes from a destabilizing to a stabilizing phase change.

Having a phase that is stabilizing for all values of gain is a big advantage as the gain can vary considerably depending on how the device is biased. The principle at stake is that the frequency at which the gate inductance resonates with the gate-drain capacitance must be low in relation to the frequency at which the drain-source capacitance resonates with the source inductance. This is demonstrated in FIGS. 4–8.

Figure 4:
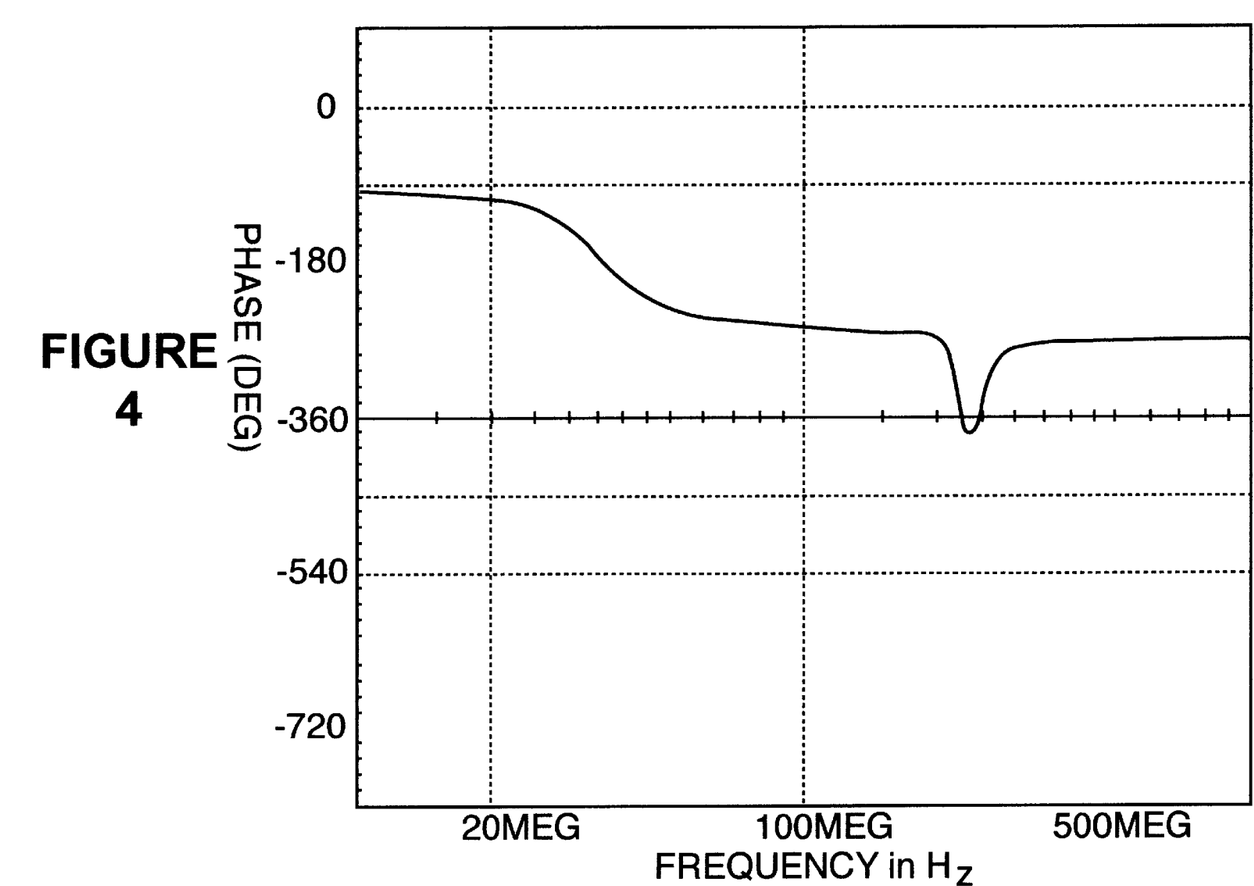
FIG. 4 illustrates the phase of the loop gain of FIG. 3 with a gate inductance L3 equal to 8 nH.

FIG. 4 illustrates the phase of the loop gain with a gate inductance L3 equal to 8 nH.

Figure 5:
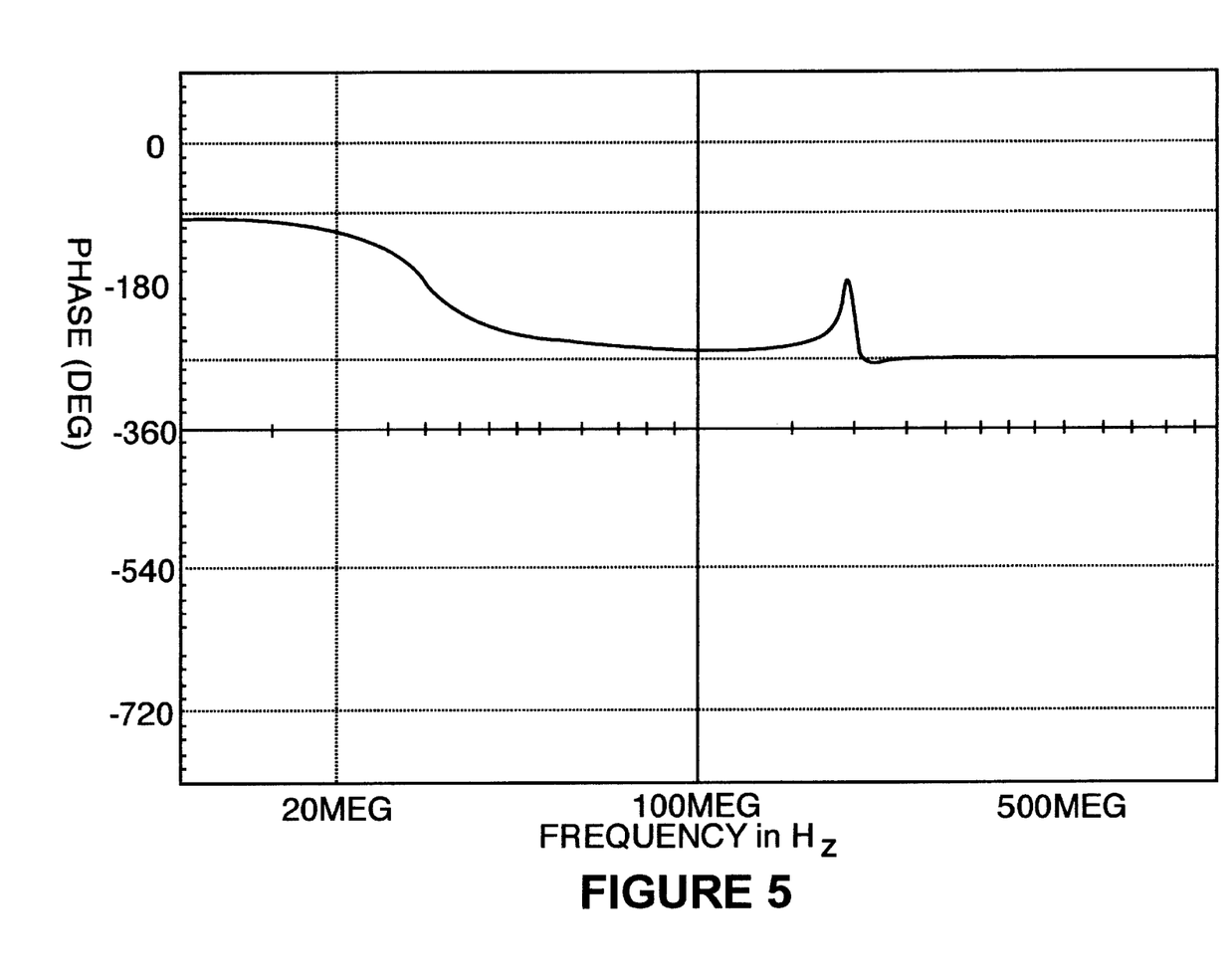
FIG. 5 illustrates the phase of the loop gain of FIG. 3 with a gate inductance L3 equal to 12 nH.

FIG. 5 illustrates the phase of the loop gain with a gate inductance L3 equal to 12 nH.

Figure 6:
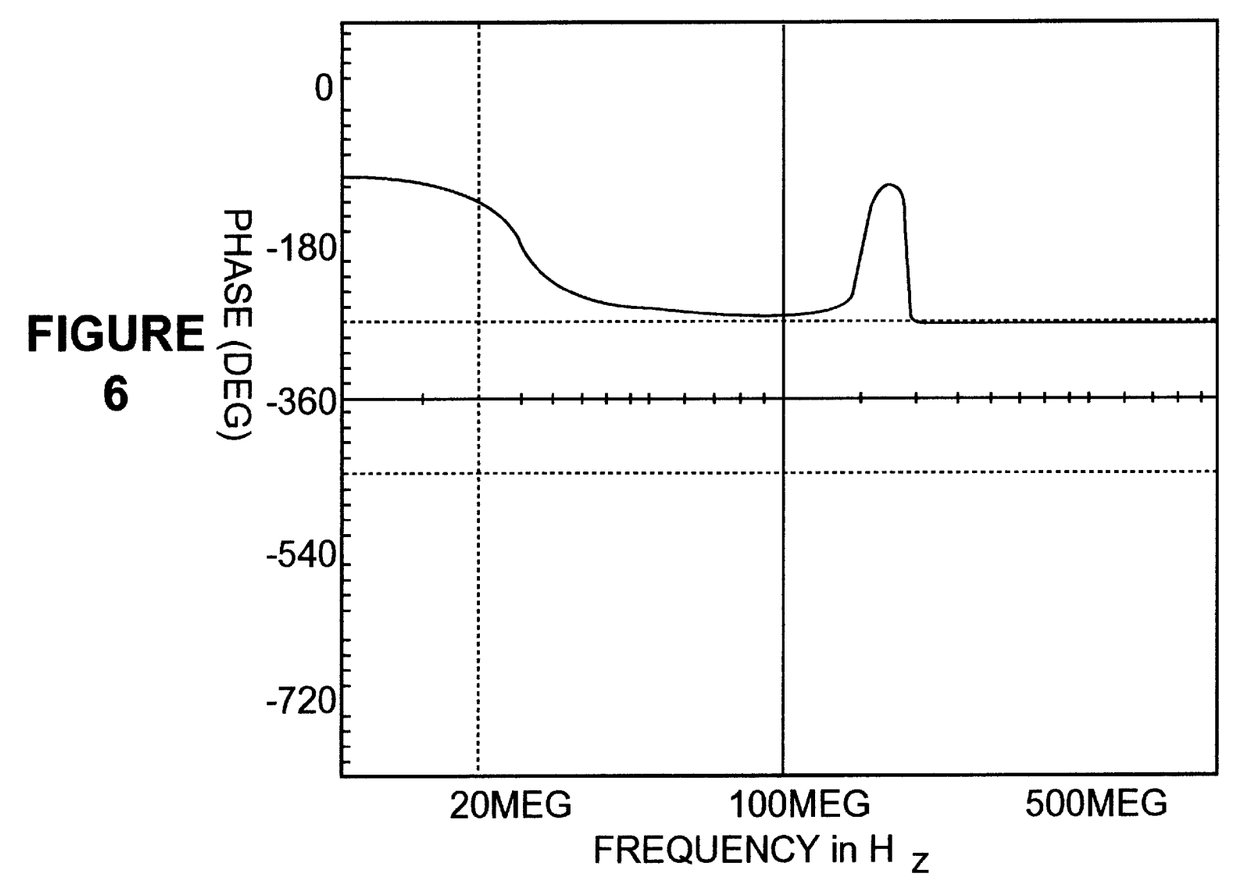
FIG. 6 illustrates the phase of the loop gain of FIG. 3 with a gate inductance L3 equal to 22 nH.

FIG. 6 illustrates the phase of the loop gain with a gate inductance L3 equal to 22 nH.

Figure 7:
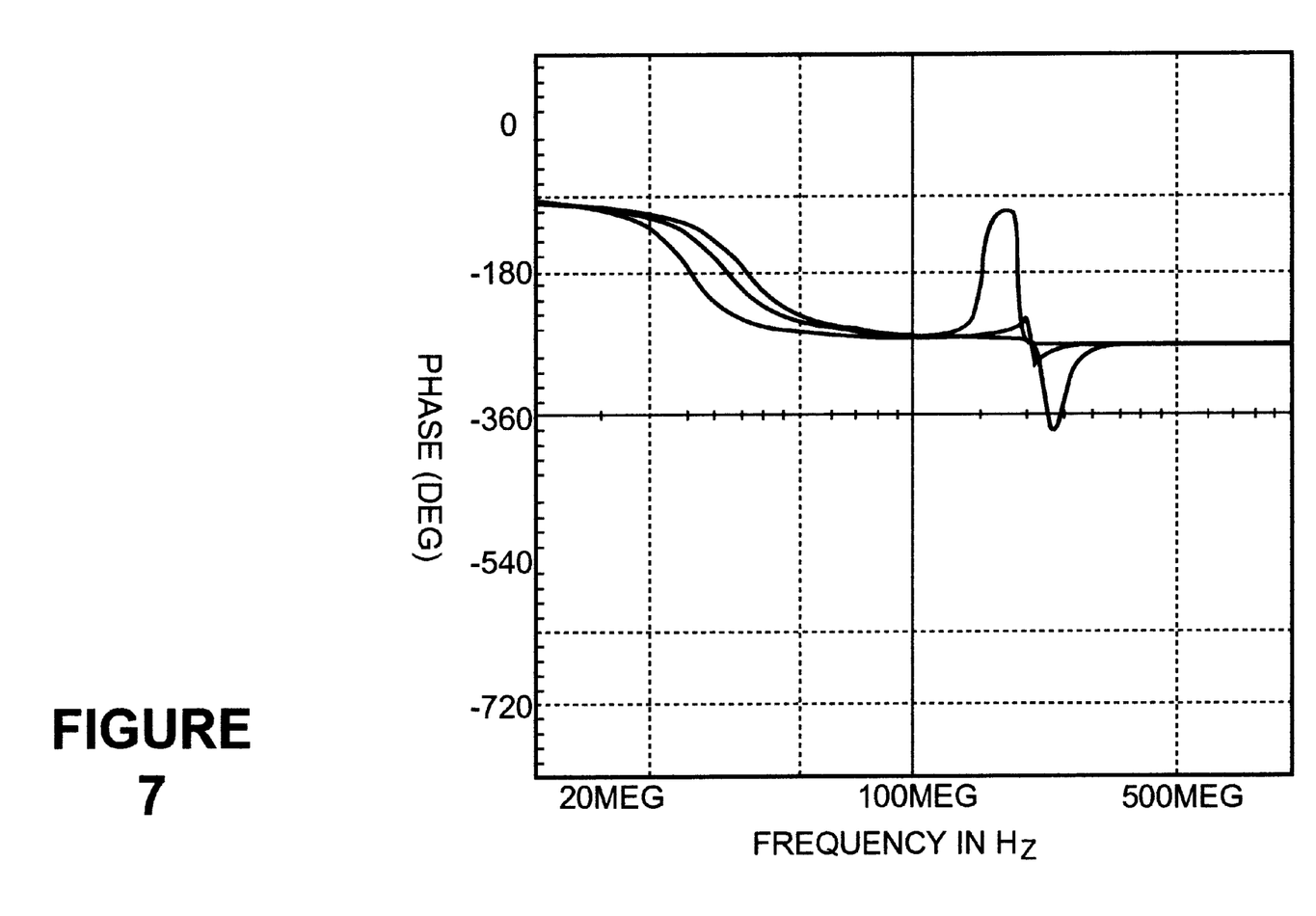
FIG. 7 illustrates the phase of the loop gains of FIG. 3 for gate inductances L3 of 8, 12, and 22 nH.
Figure 8:
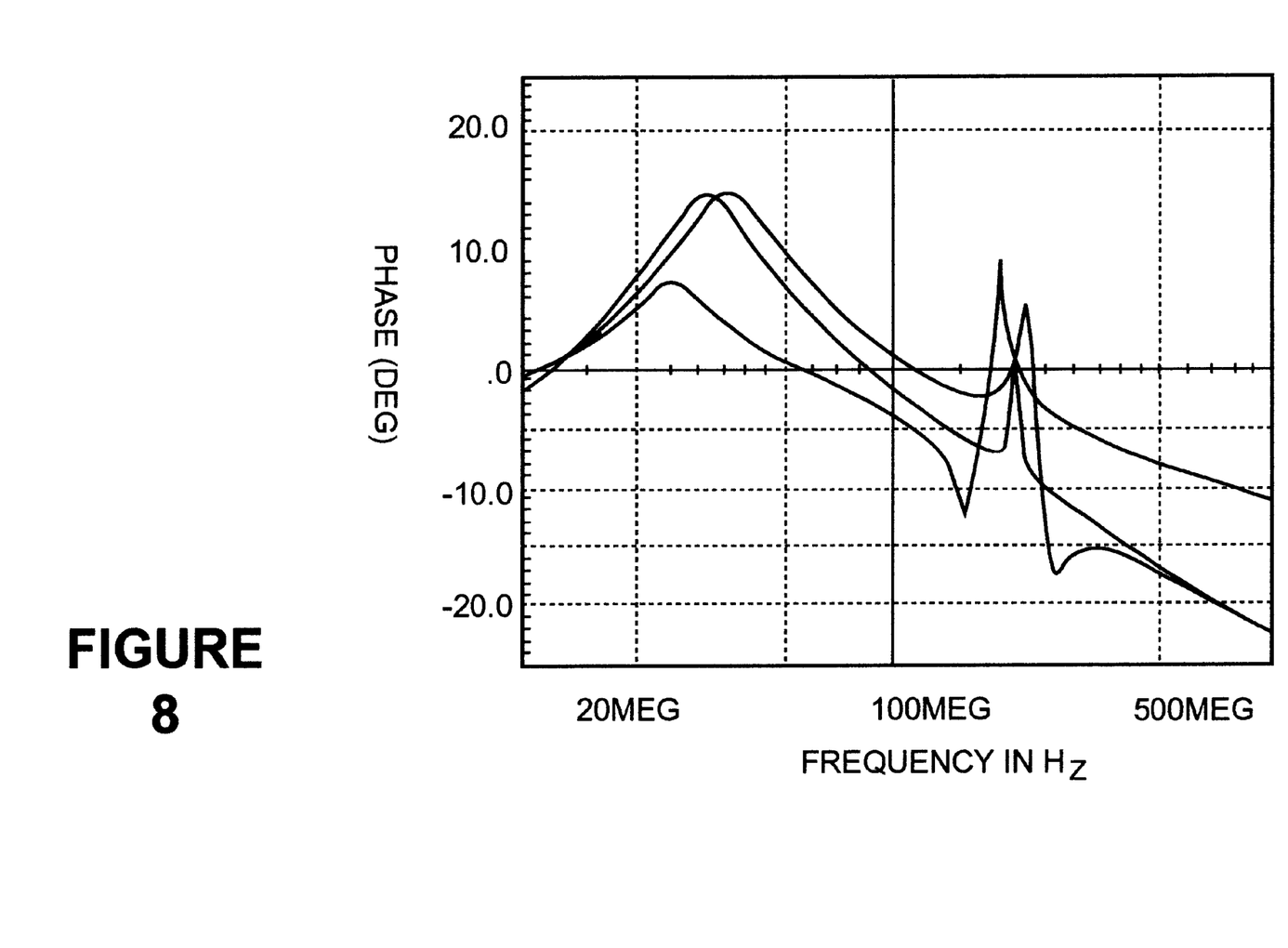
FIG. 8 shows the magnitude of the loop gains for gate inductances (L3 in FIG. 3) of 8, 12 and 22 nH.

FIG. 7 illustrates the phase of the loop gains for gate inductances L3 of 8, 12, and 22 nH. FIG. 8 Illustrates the magnitude of the loop gains for gate inductances of 8, 12, and 22 nH. Note that these magnitudes are for a current gain of 2, so they can increase by as much as 30 dB from these values for typical devices. Since the bias affects the exact values of the linearized capacitances, some margin is desired.

Figure 9:
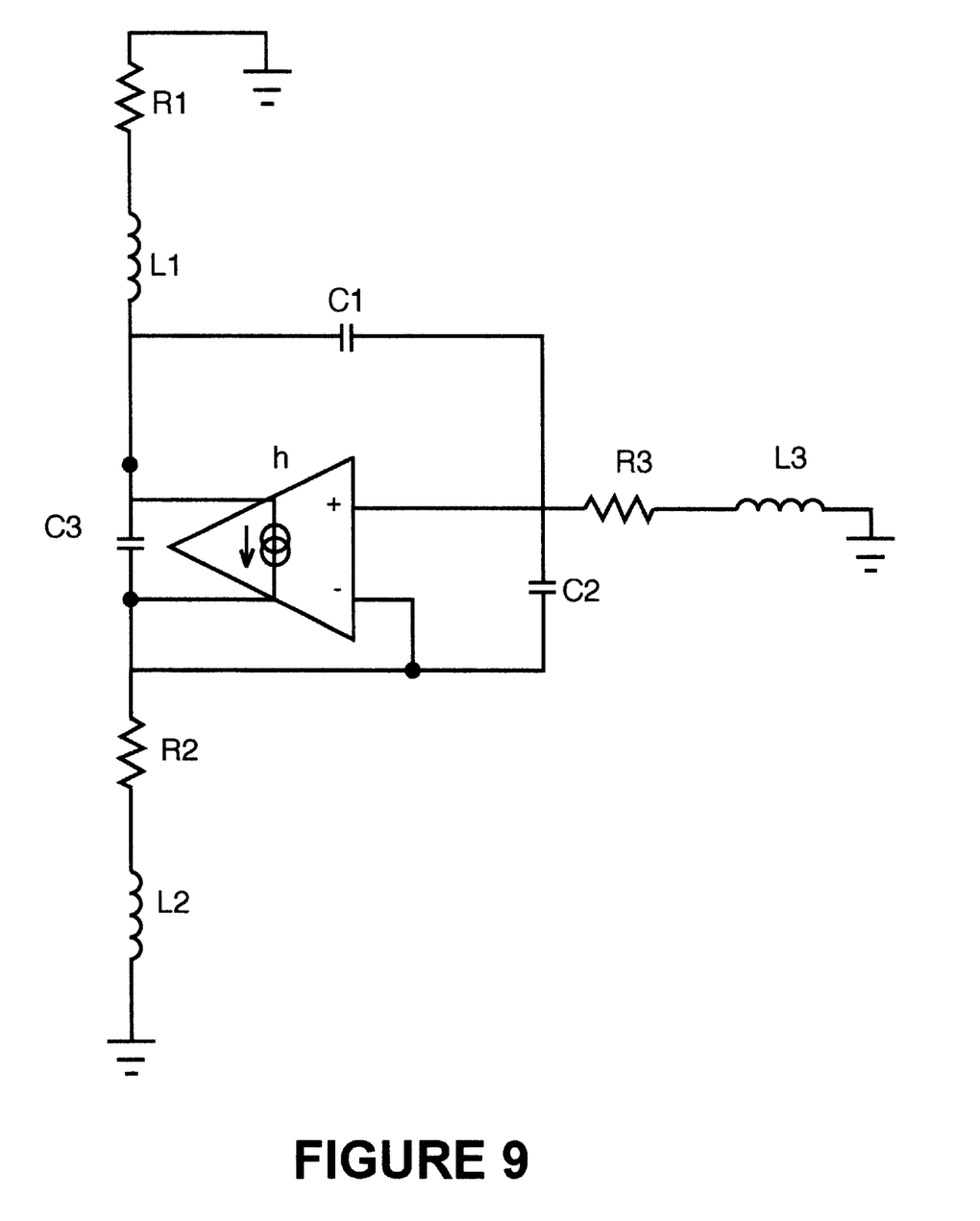
FIG. 9 is another equivalent model of a single die used to calculate the effect of the gate inductance on the closed loop pole positions with respect to a disturbance.

The linearized equivalent circuit of FIG. 3 is sufficient for illustrating the two parallel resonances and the effect on stability. A slightly more detailed equivalent circuit is shown in FIG. 9. Using this circuit the subset of the closed loop poles with respect to a disturbance that can possibly have positive real parts can be calculated as a function of the gate inductance.

Figure 10:
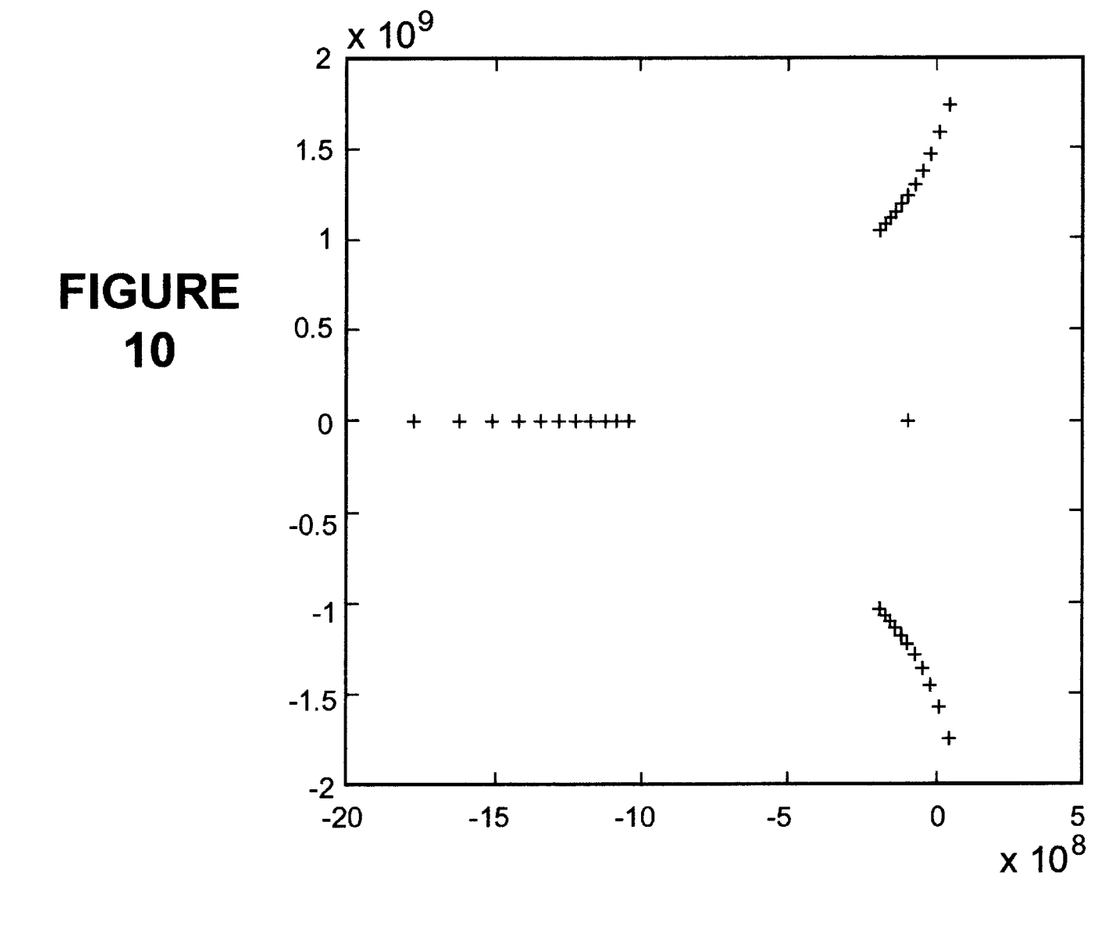
FIG. 10 shows the effect of gate inductance on the closed loop pole positions with respect to a disturbance.
Figure 11:
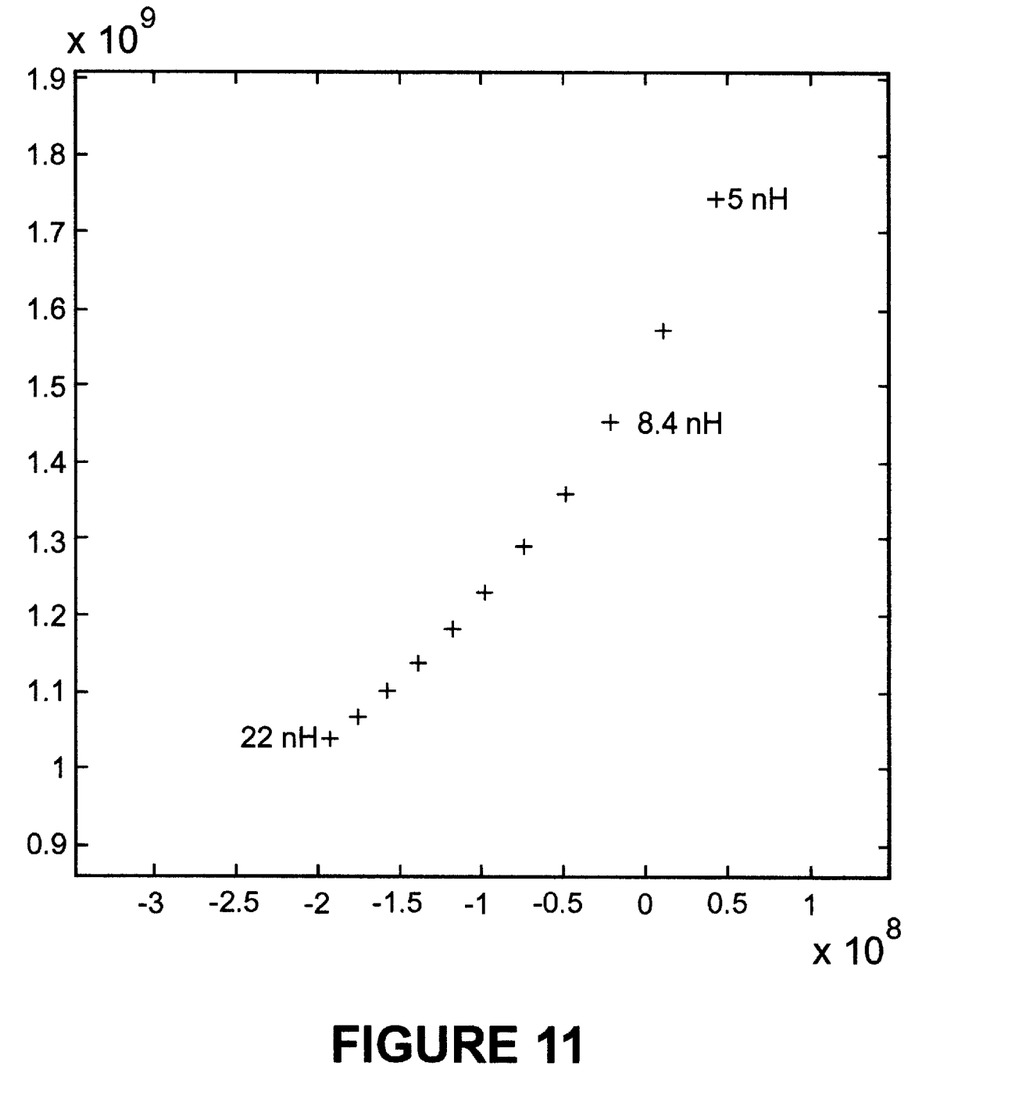
FIG. 11 is a close up view of FIG. 10 showing the effect of gate inductance on the closed loop pole positions with respect to a disturbance.

The subset of pole positions referred to above, as a function of gate inductance is shown in FIG. 10. The closed loop positions are plotted as a function of the gate inductance where $C_1=50$ pF, $C_2=1.45$ nF, $C_3=100$ pF, $R_1=0.2\Omega$, $L_1=0.1$ nH, $R2=0.4\Omega$, $L_2=6$ nH, $R_3=1.5\Omega$, and h=6 A/V. h is the linearized current gain which is the change in drain to source current divided by the change in gate to source voltage. FIG. 11 illustrates a close up view of the closed loop pole positions as a function of the gate inductance.

In configurations of devices where multiple devices are combined to act as a single device, there is usually a gate distribution network of some sort to electrically connect the gate terminals of each device to a common gate connection. The analysis shows that inductance between the gate terminal of each die and the point where the gate terminals of the die are first connected together can prevent internal oscillations. The inductance of the gate distribution network from the point where the gate terminals are first connected together to the common gate connection has no effect on the stability of the configuration with respect to internal oscillations. Many prior art configurations of devices have sufficient gate inductance because either the source inductance is small enough so that very little gate inductance is required, or the inductance of the gate bond wires provide sufficient inductance. However when more and or larger die are combined in configurations where low impedance connections between the sources of all devices are impractical, the gate bond wires no longer provide adequate gate inductance. In the design of isolated configurations of devices, i.e. configurations in which the source terminal is not intended to be connected to the local ground reference, prior art configurations have difficulty in achieving low impedance connections between the sources of all devices. This is because in larger configurations the source connections are traditionally placed facing the perimeter of the configuration allowing a low inductance connection to the local ground reference.

It would be desirable if there were provided a configuration for combining multiple FETs for switching high frequency, high power applications that did not have internal oscillations and at the same time does not degrade the performance of the configuration.

It is an object of this invention to design an effective configuration for combining multiple FETs by changing the gate inductances of each device to eliminate internal oscillations without increasing, or only slightly increasing, the external inductance of the configuration.

SUMMARY OF THE INVENTION

There is provided by this invention a configuration for combining multiple MOSFET devices for high power, high frequency applications that prevents internal oscillations. Stability of the configuration is obtained by increasing the inductance between the gate of each device in the configuration and the point where the gates are first connected together. The gate distribution network for the multiple devices are split such that each MOSFET die has an individual gate feed that are subsequently connected at a common point. The sequence at which the gate and source resonances occur within the configuration is manipulated in order to ensure stability. Such manipulation may also include unusual configurations to ensure very low inductance between the source of each die and the point where the sources are first connected together.

BRIEF DESCRIPTION OF THE DRAWINGS

FIG. 3b allows easy calculation of the loop gain of the circuit shown in FIG. 3a;

BRIEF DESCRIPTION OF THE PREFERRED EMBODIMENTS

With increased integration in electronic devices it is recognized that multiple semiconductor devices such as MOSFET die can be integrated in a bigger assembly without first combining the devices in a package and then integrating the package in the larger assembly. Since the principles described here apply equally to packaged devices consisting of a supporting structure like a ceramic or metal base with the devices mounted on the supporting structure and devices integrated into the bigger assembly, a configuration of devices is disclosed without requiring that the configuration be assembled into a packaged device.

The sequence in terms of frequency at which the resonances occur for configurations of multiple devices, described in the background of the invention, can be manipulated in order to ensure stability. One way of manipulating the gate inductance without affecting the external inductance is to split the gate distribution network to each die to increase the inductance between the gate of each die and the point where the gates are first connected together. In this configuration each die has a separate and individual gate feed. This configuration has been found to be very effective at frequencies below 500 MHZ.

Configurations that place the first point where the sources are connected together in the center of the configuration are less likely to suffer from internal oscillations. Such configurations can be combined with a split gate feed to achieve stability. A number of such configurations are described. Off course the same can be achieved by vertical integration of the connections.

The inductance of the gate distribution network can be utilized by splitting up the gate distribution network so that a larger portion of the inductance appears between the gate terminals of each die and the first point where the gate terminals are first connected together than between this point of first connection and the common gate connection. In doing so the gate inductance of the configuration is hardly increased, if increased at all, while at the same time preventing internal oscillations.

Splitting the feed in this way provides the required inductance between the gate of each device and the point where the devices are first connected together without increasing significantly, or at all, the effective gate inductance of the configuration. In this way internal stability is achieved without affecting, or affecting very little, the performance of the configuration. The same technique applies to other semiconductor devices that acts as a voltage controlled current source when linearized. Insulated gate bipolar transistors fall in this category. Wherever the term inductance is used, the effective inductance is implied. Therefore in a resistor or transmission line the effect may be that of an inductor, without referring to such a device as an inductor.

Figure 12:
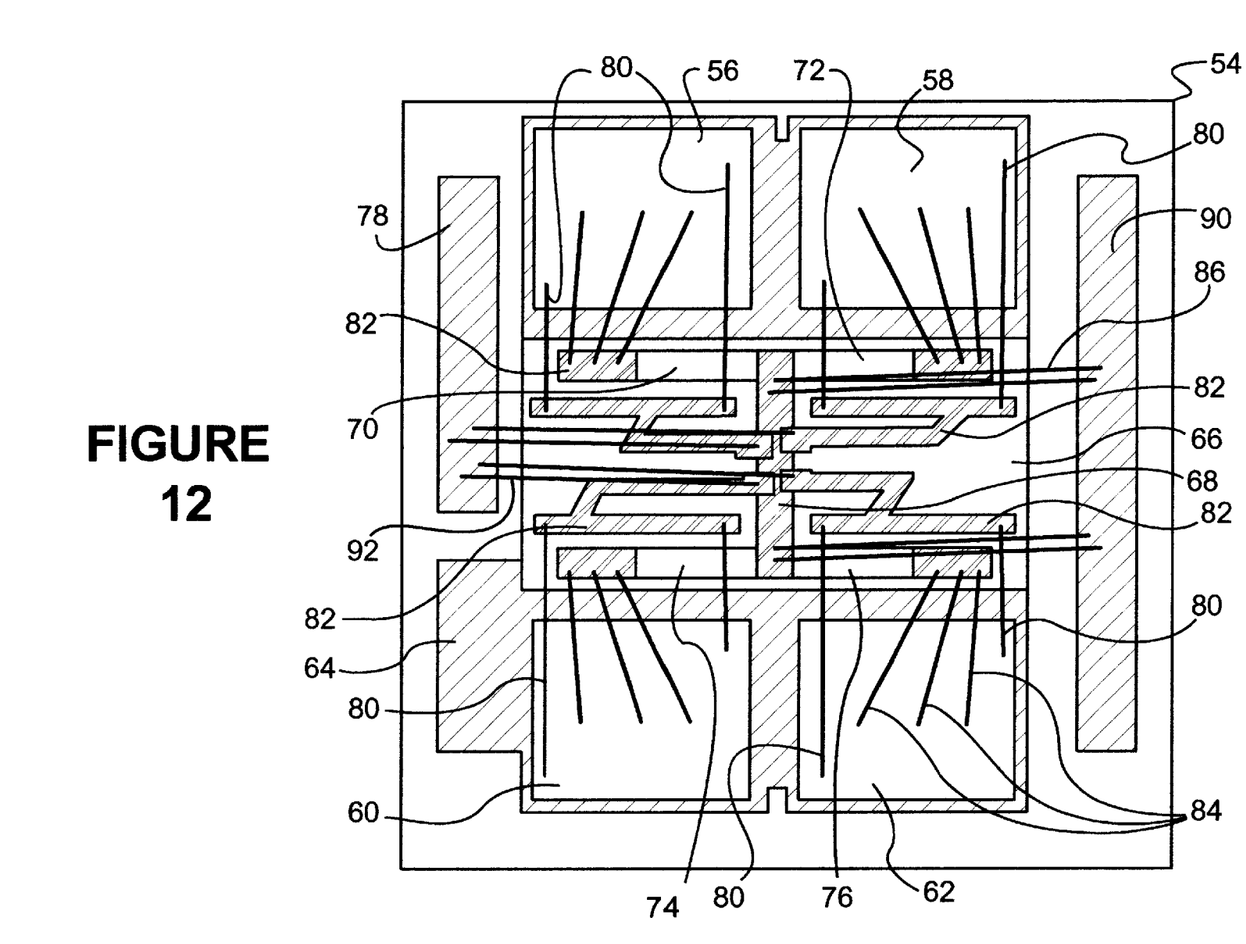
FIG. 12 is an illustration of an embodiment showing a split gate design for combining 4 die in a single package.

FIG. 12 shows a split gate feed design. The design consists of a ceramic substrate 54 on which four FET die 56, 58, 60, and 62 are mounted. Metallization 64 on the top of the ceramic substrate 54 connect the drains of the FET die together with very low inductance and also forms the connection point for the drain terminal. A second ceramic substrate 66 on top of the bottom substrate 54 is used to provide gate and source connections. A bottom metallization 68 on the top substrate 66 connects the sources of the four die together through the source resistors 70, 72, 74, and 76. The bottom metallization 68 is electrically isolated from the top metallization 82 by a dielectric layer (not shown). The top metallization 82 implements a split gate design to increase the inductance from the gate of each die to the point where the gates are first connected together. In this design the gates are first connected together at the gate terminal 78 so that the maximum inductance can be realized. Also shown are wire bonds such as 80 that connect the gate of each die to the gate metallization 82. Wire bonds such as 84 connect the source of each die to the source resistors. Wire bonds such as 86 connect the combined sources to the source terminal 90. Wire bonds such as 92, that are considered part of the gate distribution network, connect the gates of each die to the gate terminal 78 which in this case is the first point where the gates of the devices are first connected together. The split gate feed design employed in this embodiment provides a large stability margin without significantly increasing the effective gate inductance of the combined device package.

An alternative way to prevent internal oscillations is to ensure that the inductance from the source of each die to the point where the sources connect together for the first time is very low. This may require a departure from the external pin-outs typically used for single die devices.

Figure 13:
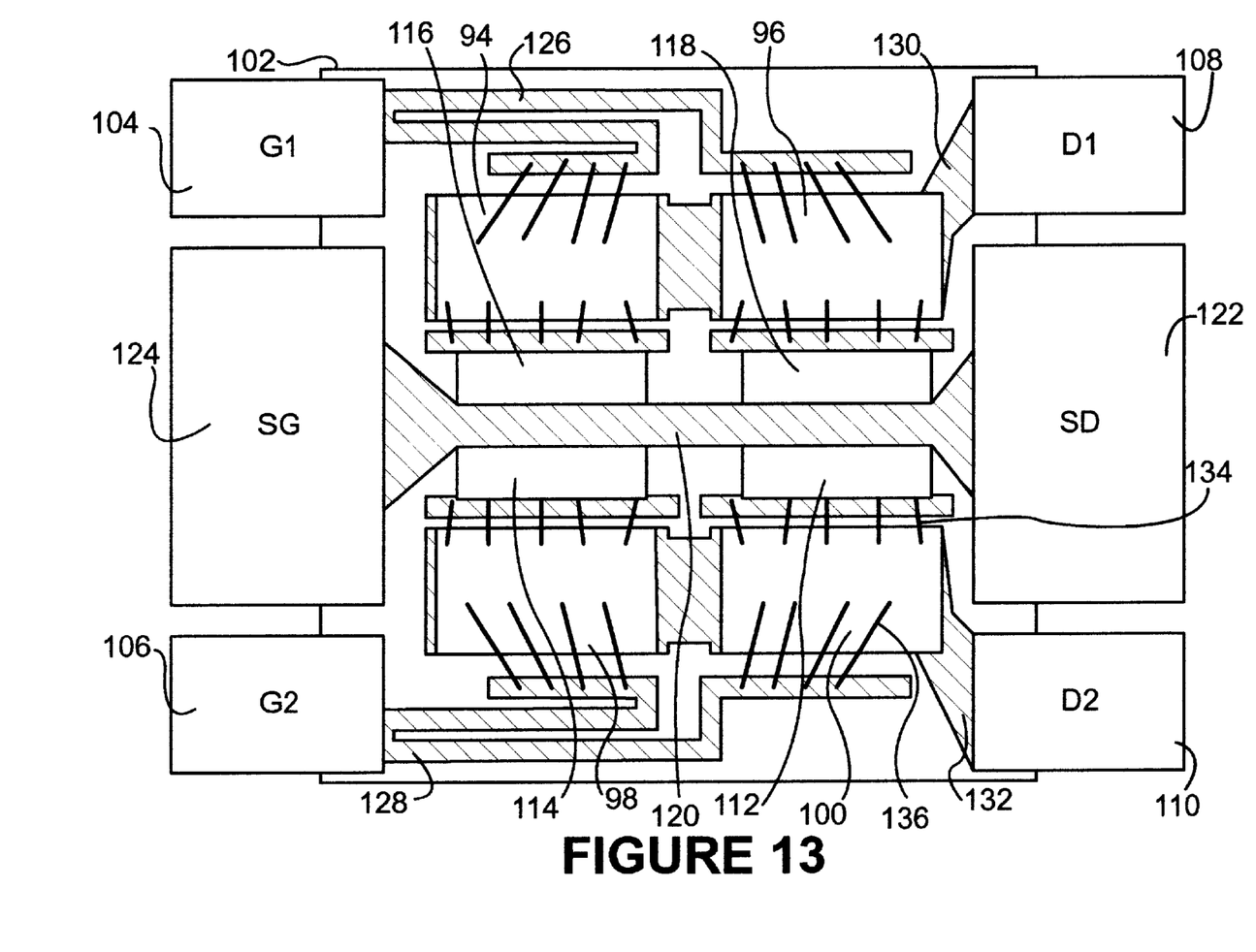
FIG. 13 is another illustration of an embodiment showing a split gate design combined with an unconventional terminal arrangement for combining 4 die in a single package.

FIG. 13 shows a package containing 4 FET die 94, 96, 98, and 100 on a ceramic substrate 102. Instead of the usual single drain and gate terminals and multiple source terminals, this device uses 2 separate gate terminals 104 and 106 as well as two separate drain terminals 108 and 110. The sources from the individual die are connected through source resistors 112, 114, 116, and 118 to a common source metallization 120 running along the middle of the package. Two source terminals 122 and 124 are provided. For additional stability margin split gate metallization 126 and 128 are used. Also shown are the metallizations 130 connecting together the drains of the two top die to the terminal 108 and metallization 132 connecting the drains of the bottom two die to the terminal 110. Bond wires such as 134 connect the sources of the die to the source resistors. Bond wires such as 136 connect the gates of the die to the gate metallization 126 and 128.

The concept behind this design is that inductance in the electrical path connecting the drains of the die together is much better tolerated from a stability point of view than inductance in the electrical path connecting the sources together. Having the source metallization in the middle minimizes the inductance from the source of each die to where the sources are first connected together. The gate and drain terminals can be connected together external to the package with little risk of causing internal oscillations.

It can be readily seen that there is provided a novel configuration for combining multiple FET die that provides greater stability by eliminating internal oscillations in configurations where multiple individual FETs have been combined. Although there is illustrated and described specific structure and details of operation, it is clearly understood that the same were merely for purposes of illustration and that changes and modifications may be readily made therein by those skilled in the art without departing from the spirit and the scope of this invention.

I claim:

1. A configuration for combining multiple semiconductor devices, comprising:
   a) a supporting structure;
   b) a plurality of semiconductor devices mounted on the supporting structure and disposed to be connected in a parallel configuration;
   c) the plurality of semiconductor devices has a common input terminal, a common output terminal, and a common reference terminal;
   d) each of the semiconductor devices having an input terminal, an output terminal, and a reference terminal;
   e) each semiconductor device input terminal has an electrical connection with an inductance L1 to an input distribution network;
   f) the input distribution network connects each semiconductor device input terminal to a common point where all the semiconductor device input terminals are connected together wherein the inductance between each semiconductor input terminal and the common point of connection is L2; and
   g) an inductance L3 between the point where all input terminals of each semiconductor device is connected together and the common input terminal, wherein L2 is at least 10 percent larger than the sum of L1 and L3.

2. A configuration for combining multiple semiconductor devices as recited in claim 1 wherein the configuration is a packaged device.

3. A configuration for combining multiple semiconductor devices as recited in claim 1 wherein the reference terminal is not connected to a local ground reference.

4. A configuration for combining multiple semiconductor devices as recited in claim 1 wherein the reference terminals are connected together at a common point at the approximate center of the configuration.

5. A configuration for combining multiple semiconductor devices as recited in claim 4 wherein the plurality of semiconductor devices are metal oxide field effect transistors wherein the gate is the input terminal, the source is the reference terminal and the drain is the output terminal.

6. A configuration for combining multiple semiconductor devices, comprising:
   a) a supporting structure;
   b) a plurality of semiconductor devices mounted on the supporting structure;
   c) each of the plurality of semiconductor devices having an input terminal, an output terminal, and a reference terminal;
   d) the plurality of semiconductors devices are arranged in a configuration such that the reference terminals are connected together at a common point at the approximate center of the configuration; and
   e) at least two separate external terminals are connected to the common point of connection of the reference terminals.

7. A configuration for combining multiple semiconductor devices as recited in claim 6 wherein the configuration is a packaged device.

8. A configuration for combining multiple semiconductor devices as recited in claim 7 wherein the reference terminal is not connected to a local ground reference.

9. A configuration for combining multiple semiconductor devices as recited in claim 8 wherein the plurality of semiconductor devices are metal oxide field effect transistors wherein the gate is the input terminal, the source the reference terminal and the drain the output terminal.

10. A configuration for combining multiple semiconductor devices as recited in claim 9 in which there are provided at least one external connection to the semiconductor devices' input terminals positioned on the outer periphery of the package and at least one external connection to the semiconductor devices' output terminals positioned on the outer periphery of the package opposite the position of the input terminals.

11. A configuration for combining multiple semiconductor devices as recited in claim 9 in which there are provided multiple external connections to the semiconductor devices' input terminals positioned on the outer periphery of the package.

12. A configuration for combining multiple semiconductor devices as recited in claim 9 in which there are provided multiple external connections to the semiconductor devices' output terminals positioned on the outer periphery of the package.

* * * * *